US007482965B1

(12) United States Patent
Coker et al.

(10) Patent No.: US 7,482,965 B1
(45) Date of Patent: Jan. 27, 2009

(54) DIGITAL CHIRP WAVEFORM GENERATOR AND METHOD

(75) Inventors: Jonathan D. Coker, Rochester, MN (US); Robert A. Kertis, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 341 days.

(21) Appl. No.: 11/305,819

(22) Filed: Dec. 16, 2005

Related U.S. Application Data

(60) Provisional application No. 60/637,240, filed on Dec. 17, 2004.

(51) Int. Cl.
*H03M 1/12* (2006.01)

(52) U.S. Cl. ...................................... 341/156; 341/144

(58) Field of Classification Search .......... 341/144-170
See application file for complete search history.

(56) References Cited

U.S. PATENT DOCUMENTS

| | | | | |
|---|---|---|---|---|
| 5,469,479 | A * | 11/1995 | Chang et al. | 375/377 |
| 6,107,910 | A * | 8/2000 | Nysen | 340/10.1 |
| 6,774,832 | B1 * | 8/2004 | Essenwanger | 341/143 |

OTHER PUBLICATIONS

M. J. Narasimha, K. Shenoi, and A.M. Peterson, Quardratic Residues: Application to chirp filters and discrete fourier transforms. Acoustics, Speech, and Signal Processing IEEE International Conference on ICASSP' 76, Apr. 1, 1976.

Jr. Chren. W.A. "Area and latency improvements for direct digital synthesis using the residue number system" In Circuits and Systems, 1994., Proceedings of the 37th Midwest Symposium on, vol. 1, paes 269-273 vol. 1, 1994.

L. I. Bluestein, "A linear filtering approach to the computation of discrete Fourier transform". IEEE Transactions on Audio and Electroacoustics, AU-18, Dec. 1970.

P.V.A. Mohan. "On RNS-based enhancements for direct digital frequency synthesis". Circuits and Systems II: Analog and Digital Signal Processing, IEEE Transactions on (see also circuits and Systems II: Express Briefs, IEEE Transactions on), pp. 988-990. Oct. 2001.

* cited by examiner

*Primary Examiner*—Lam T Mai
(74) *Attorney, Agent, or Firm*—Faegre & Benson LLP

(57) ABSTRACT

A chirp waveform generator for producing a chirp waveform $f(t)=\sin(t^2 \text{ modulus } m)$ where modulus m is represented by n submoduli and/or factored submoduli $m_1$-$m_n$. Sequence generators generate digital sequence values representative of sequences of quadratic residues for each submoduli and/or factored submoduli $m_1$-$m_n$. Sine and cosine digital-to-analog converters (DACs) connected to the sequence generators receive the digital sequence values for each submoduli and/or factored submoduli $m_1$-$m_n$ and produce sequences of corresponding analog sine and cosine signals. An analog processor including adders and multipliers connected to the DACs combines the sine and cosine signals to produce the chirp waveform. The argument ($t^2$ modulus m) is an implemented phase argument that approximates a desired phase argument ($\pi r t^2$). Programmable inputs on the sequence generators enable control over waveform parameters including starting phase, ramp rate and frequency.

13 Claims, 8 Drawing Sheets

*Output = Sin(A)*Cos(B)*Cos(C) + Cos(A)*Sin(B)*Cos(C) + Cos(A)*Cos(B)*Sin(C) - Sin(A)*Sin(B)*Sin(C) = Sin(A+B+C)*

DIGITAL CHIRP WAVEFORM GENERATOR AND METHOD

REFERENCE TO RELATED APPLICATION

This application claims the benefit of U.S. Provisional Application Ser. No. 60/637,240, filed on Dec. 17, 2004, and entitled "Direct Digital Chirp Signal Synthesis," which is incorporated herein by reference in its entirety.

GOVERNMENT LICENSE RIGHTS

The invention was made with funding support provided by the U.S. government. The U.S. government may have certain rights to the invention

FIELD OF THE INVENTION

This invention relates generally to circuits for generating waveform signals. In particular, the invention is a circuit for generating chirp waveform signals.

BACKGROUND OF THE INVENTION

A classical chirp sinusoid is represented simply by $$f(t)=\sin(\pi r t^2) \quad \text{Eq. (1)}$$

where the time origin is chosen to be the point where the chirp waveform passes through zero frequency. The derivative of the phase argument is 2πrt, indicating that the constant r expresses a phase acceleration, or frequency ramp rate in frequency per unit time. If r is large, then the function $f(t)$ appears very non-sinusoidal, moving in instantaneous frequency from DC to high frequency in a short time. However, if r is small, then the function $f(t)$ appears to approximate a sinusoid of constant frequency for relatively-long time periods.

The function $f(t)$ may equally well be written as $$f(t)=\sin(\pi r t^2 \bmod 2\pi) \quad \text{Eq. (2)}$$

where mod represents a modulus operation. If the angular units of the argument are changed to those where the quantity $$\frac{2}{r}$$

represents a full period, and furthermore the time unit is taken to be that of the sampling frequency $f_s$, then the function can be written as the sampled function $$f_t=\sin_m(t^2 \bmod m) \quad \text{Eq. (3)}$$

where in general $m=2f_s^2/r$, representing the angle which corresponds to 2π radians. The integer t represents the $t^{th}$ sampling instant, and the modified function $\sin_m()$ indicates that the units of the argument are such that the modulus m represents 2π radians.

It is assumed that r and $f_s$ are such that m is an integer. For a fixed $f_s$, this assumption amounts to a quantization constraint in the frequency ramp rate r. For typical applications, choices for r remain practically continuous even with fixed $f_s$. The choices are fully continuous if $f_s$ need not be exactly fixed at design time. For a frequency ramp rate r in the range of 1 MHz per microsecond, played at a typical sample rate of 1 Gs/s, m=2,000,000. The next available integral choice for m (2,000,001) would give a ramp rate slightly smaller than 1 MHz per microsecond (smaller by 1 part in 2 million).

The phase of the sinusoid function, $a=t^2 \bmod m$, in equation 3, generates a sequence of integers. Each of these integers is called a quadratic residue of m. Some older textbooks such as Charles Varden Eynden, *Number Theory: An Introduction to Proof*, International Textbook Company, 1970, further stipulate that a quadratic residue must also be coprime with the modulus m. The terms "coprime" and "relatively prime" both describe a set of numbers that share no common factors. However, the broader, more-modern definition is used herein. Number theory texts have many pages devoted to the properties of this deceptively simple function. It is, for example, relatively easy to find a given an integer t. However, it is nontrivial, in the general case, to find t when a is given (or even to determine whether there exists such a t).

For example, if m=16, then the generated sequence of quadratic residues begins with 0,1,4,9,0,9,4,1,0,1,4,9,0,9,4, 1, . . . . The sequence appears to repeat indefinitely. Only 4 quadratic residues appear to exist modulo 16, when one might expect to observe as many as 16.

Conventional high speed chirp waveform signal generators are complex and have relatively high power requirements. There is a need for improved chirp waveform signal generators. In particular, there is a need for chirp waveform signal generators that operate at high speed with relatively low power requirements.

SUMMARY OF THE INVENTION

The invention is an efficient-to-implement and low power circuit for generating sinusoid, chirp and other waveform signals. One embodiment of the invention is a sinusoid waveform generator for producing a sinusoid waveform $f(t)=\sin$(t modulus m) where modulus m is represented by n submoduli and/or factored submoduli $m_1$-$m_n$. The waveform generator includes sequence generators, sine and cosine digital-to-analog converters (DACs) and an analog processor. The sequence generators generate digital sequence values representative of sequences of linear residues for each submoduli and/or factored submoduli $m_1$-$m_n$ The sine and cosine DACs are connected to the sequence generators to receive the digital sequence values for each submoduli and/or factored submoduli $m_1$-$m_n$, and produce sequences of corresponding analog sine and cosine signals. The analog processor is connected to the DACs and combines the sine and cosine signals to produce the sinusoid waveform.

In another embodiment of the invention the sequence generators include programmable inputs that enable control over waveform parameters such as starting phase and frequency. The analog processor can be implemented with adders and multipliers. The argument (t modulus m) is an implemented phase argument that approximates a desired phase argument (πrt).

DETAILED DESCRIPTION OF THE PREFERRED EMBODIMENTS

Figure 1:
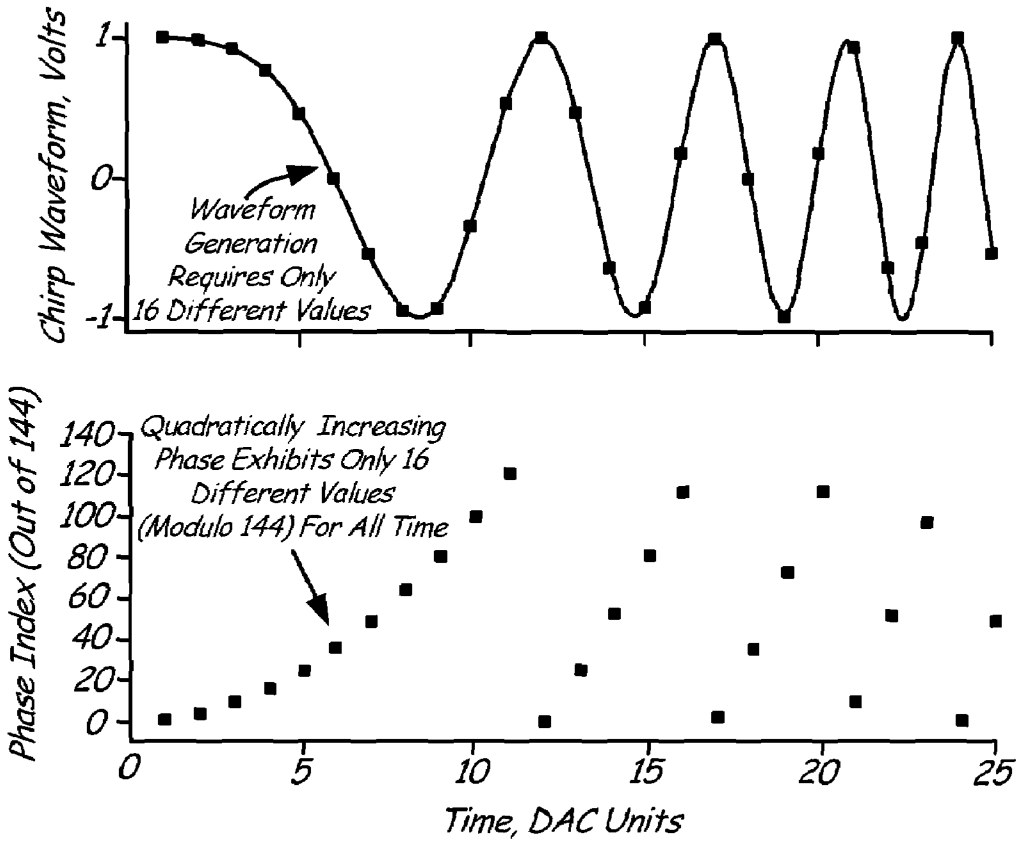
FIG. 1 is a graphical example of the amplitude and phase components of a chirp waveform that can be generated in accordance with the present invention.

A basis of the invention is the realization that there may exist a reasonably small number of quadratic residues for much larger (and more useful) values of m. A chirp waveform demonstrating this concept is shown in FIG. 1. The initial behavior of Equation 3 is shown, with the modulus m set at 144. 16 quadratic residues of 144 exist. They are {0,1,4,9,16, 25,36,49,52,64,73,81,97,100,112,121}. Each of these phases corresponds (in this case) to a unique voltage on the sinusoid. Therefore, the chirp waveform may be reproduced with only 16 voltages (played in the proper sequence). In the general case, because a sinusoid is not a monotonic function, the possibility remains open that different phases may map onto the same voltage and thus the actual number of required voltages might be less than the number of quadratic residues.

Figure 2:
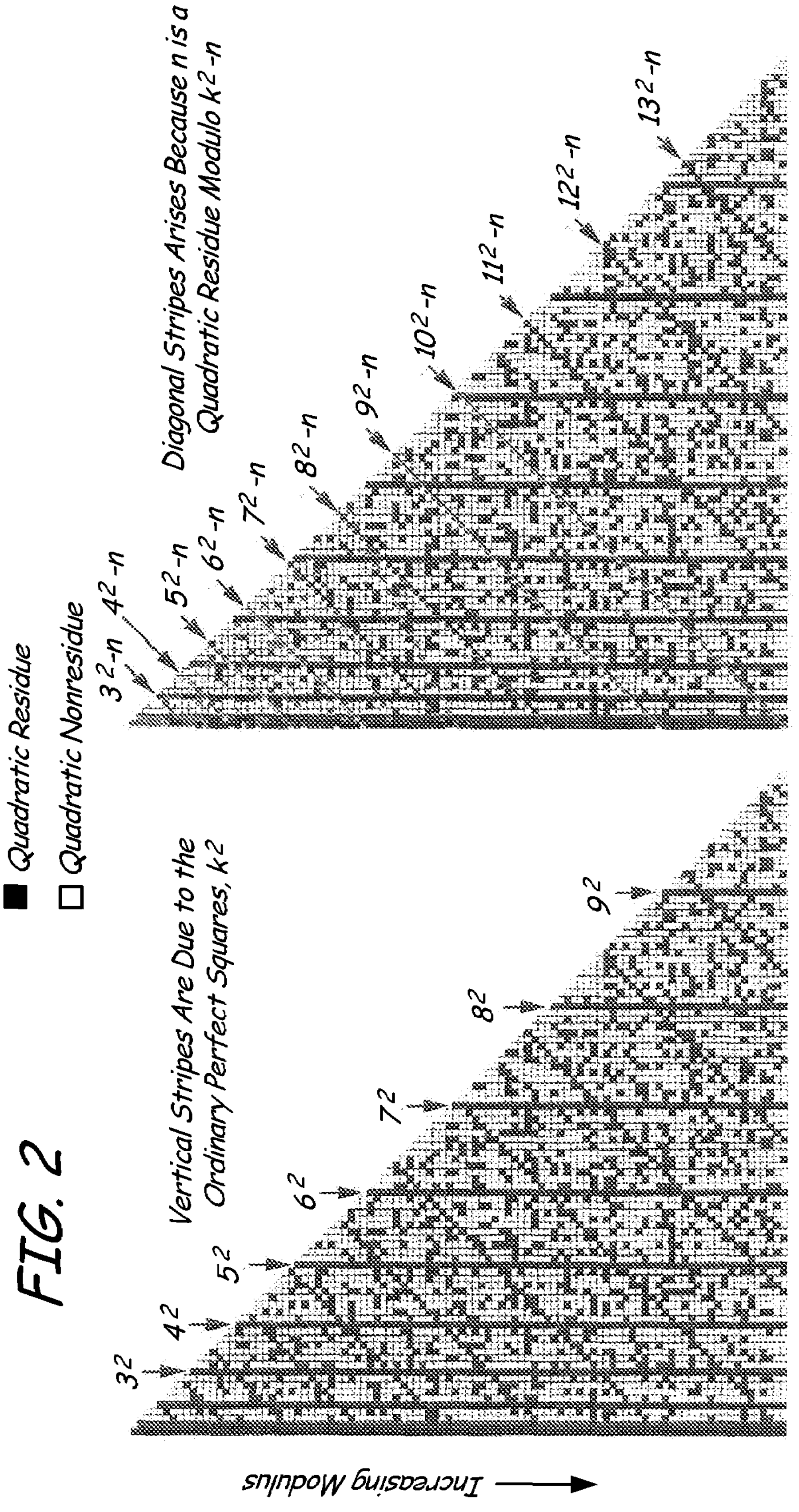
FIG. 2 is a map of quadratic residues of moduli from 1-99.

Further insight into the nature of quadratic residues can be gained by the examination of FIG. 2. The map represents quadratic residues with dark squares, and non-residues with light squares. Each modulus m from 1 to 99 is represented by horizontal groups of residues and non-residues in locations representing integers from 0 to m−1. The map gets wider as m increases. The map shows quadratic residues forming vertical, dark stripes at locations corresponding to the ordinary squares {0,1,4,9,25 . . . }. All perfect squares less than the modulus m must appear as quadratic residues. To understand the reason for the set of diagonal lines (also spaced quadratically) in FIG. 2, the following construction is introduced:

$$\begin{aligned}(k^2-k-n)^2 &\equiv (k^2-n)^2-2k(k^2-n)+k^2 && (\text{mod}\,k^2-n)\\ &\equiv k^2 && (\text{mod}\,k^2-n)\\ &\equiv (k^2-n)+n && (\text{mod}\,k^2-n)\\ &\equiv n && (\text{mod}\,k^2-n)\end{aligned} \quad \text{Eq. (4)}$$

Equation 4, which is valid for all $n<k^2$, states that n is congruent to a quadratic residue when the modulus is a perfect square, less n. Therefore, diagonal lines of unity slope exist, made up of the points corresponding to the quadratic residue n and the modulus $k^2-n$ for each k and for all n where $0<=n<=\lfloor k^2/2\rfloor$. Because Equation 4 is valid for all $n<k^2$, note the path on the graph when $n>=\lfloor k^2/2\rfloor$, which may be followed by observation of one of the lines in FIG. 2. When the unity-slope lines reach the edge of the diagram, n becomes larger than the modulus $k^2-n$, introducing a "carriage return" to the left. As n increases further, diagonal lines continue, but the "slope" is now ½ because a contribution to n constructively interferes with the reduction in the modulus $k^2-n$ in this regime. When this line reaches the edge of the graph, another "carriage return" is affected, and another line begins, but this time of slope ⅓. This pattern continues until n reaches $k^2-1$, and the modulus is 1.

Figure 3:
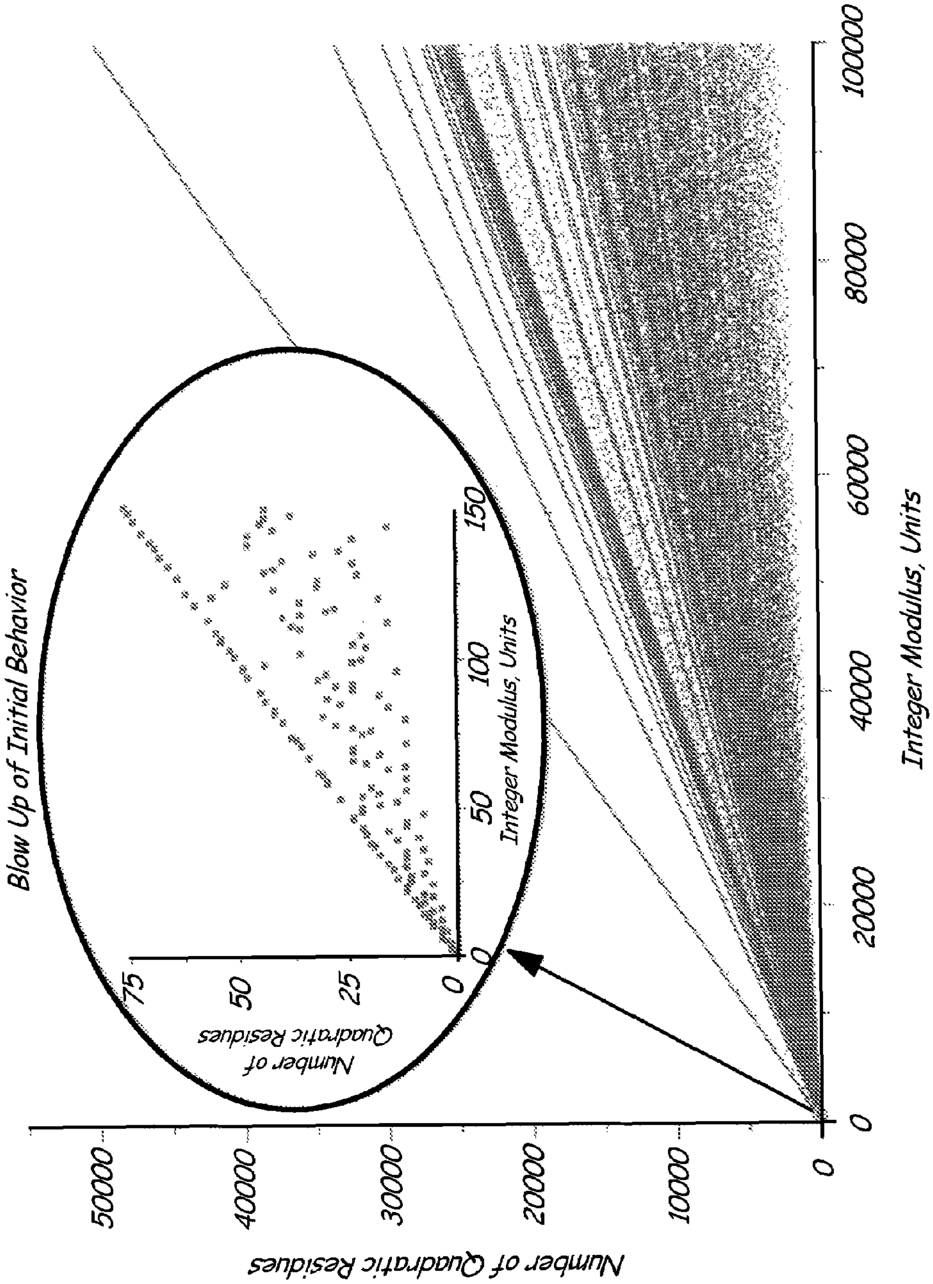
FIG. 3 is a graph of the number of quadratic residues of moduli from 1-100,000.

The number of quadratic residues which exist, modulo m, is of high interest for engineering applications using quadratic residues. FIG. 3 shows the number of unique quadratic residues for moduli less than one hundred thousand. The graph is a series of one hundred thousand points, many of which appear to form lines or portions of lines at the resolution of the chart. The nature of the graph is evident from the detail on the initial part of the graph, where it is clear that the graph is made up of discrete points. FIG. 3 shows (per the previous example) that modulus 144 exhibits 16 quadratic residues. In addition, there are very large moduli with a modest number of quadratic residues (on the order of a few thousand).

The nearly-fractal nature of FIG. 3 makes it unlikely that there exists a reasonably simple (or discoverable) function which generates the number of quadratic residues for any given m. Nevertheless, a candidate function can be generated and is presented as a conjecture.

Conjecture 2.1. The number of quadratic residues Q modulo any prime power $p^a$ is given as $$Q(p^a)=\begin{cases}\dfrac{1+2p+p^{a+1}}{2+2p}, & \text{for } p \text{ odd and } a \text{ odd;}\\ \dfrac{2+p+p^{a+1}}{2+2p}, & \text{for } p \text{ odd and } a \text{ even;}\\ \dfrac{2^a+10}{6}, & \text{for } p=2 \text{ and } a \text{ odd;}\\ \dfrac{2^a+8}{6}, & \text{for } p=2 \text{ and } a \text{ even.}\end{cases} \quad \text{Eq. (5)}$$

Furthermore, for a general composite modulus m, whose prime factorization is given by $\Pi_i p_i^{ai}$ the number of quadratic residues Q is given as $$Q(m)=Q\left(\prod_i p_i^{a_i}\right)=\prod_i Q(p_i^{a_i}) \quad \text{Eq. (6)}$$

These relations were derived essentially by inspection of the patterns found in the function Q, where the function Q was evaluated by brute force on a computer. The conjecture has been verified by exhaustive computer check for moduli less than 10,000,000. The second part of the conjecture, given in Equation 6, is in fact a consequence of the well-known Chinese Remainder Theorem (CRT) if the prime-power formulas in Equation 5 are correct.

An equivalent formulation for Q is presented in a 1976 paper. M. J. Narasimha, K. Shenoi, and A. M. Peterson. Quadratic residues: Application to chirp filters and discrete fourier transforms. Acoustics, Speech, and Signal Processing IEEE International Conference on ICASSP '76, 1, Apr. 1976. The result is stated without proof, but refers to independent proofs in theses by Narasimha in 1975 and Chang in 1972. M. J. Narasimha. Techniques in digital signal processing. PhD thesis, Stanford University, 1975. H. Chang. Chirp waveform generation using digital samples. Master's thesis, Rensselaer Polytechnique Institute, Troy, N.Y., June 1972. The Chang reference contains no such proof nor does it contain the proposition. The Narashima reference contains a proof for special cases (i.e., prime moduli), uses the CRT to extend the results to composite moduli, and outlines a proof for the general case (i.e., prime power moduli). However, key proof elements for this general case may depend on results posed as exercise problems from a 1939 textbook by Uspensky. J. V. Uspensky and M. A. Heaslet. Elementary number theory. McGraw-Hill, 1939. In 1970, Bluestein attacked a related problem involving quadratic residues for moduli which were powers of 2, but only generated an approximate result for large powers. L. I. Bluestein. A linear filtering approach to the computation of discrete Fourier transform. IEEE Transactions on Audio and Electroacoustics, AU-18, December 1970. Bluestein also cites the Uspensky reference in his argument.

Engineers may take the conjecture as proven for practical values of m below 10,000,000. Based on available literature, skeptical mathematicians may regard the proposition as unproven for larger moduli.

The number of quadratic residues modulo 262,080 can therefore be found in the following way. Because the prime factorization of 262,080 is $2^6\times3^2\times5\times7\times13$, $Q(262{,}080)=Q(2^6)\times Q(3^2)\times Q(5)\times Q(7)\times Q(13)$. By Equation 5, then, $Q(262{,}080)=12\times4\times3\times4\times7=4{,}032$ residues. Therefore, only about 15 in 1000 integers are congruent to quadratic residues modulo 262,080.

With this information the nature of the graph in FIG. 3 can be more fully understood. Equation 5 reduces to $$\frac{p+1}{2}$$

for odd primes (all primes except 2). For each prime p, a point exists on the graph with coordinates $\{p,(p+1)/2\}$, forming an apparent line with slope ½ and a y-intercept of ½. Next, consider moduli of the form 2p. According to Equation 6, these create points of the form $\{2p,Q(2)(p+1)/2=p+1\}$. These points again lie on a line with slope ½ but with y-intercept at 1 (thus this line is not identical with the first line). On average, the points on the second line are half as dense as those on the first line, because the abscissa for the former points are stretched by a factor of 2.

Generalizing this argument, there exist families of points $\{kp,Q(k)(p+1)/2\}$ for every k relatively prime top (that is, for every k that is not a multiple of the prime p). These points lie on lines of slope $Q(k)/(2k)$ and y-intercept $Q(k)/2$. Therefore, a set of lines with quantized slope are traced out with increasing sparsity as the slope decreases. This statement explains the visually-obvious structure of FIG. 3 (though the statement does not explain other, non-obvious structure which is present in the graph).

The preceding argument suggests a strategy for developing moduli which have a small number of quadratic residues. First, start with a small modulus $m_1$, such as a prime on the line $\{p,(p+1)/2\}$. If the modulus $m_1$ is multiplied by another number $m_2$ which exhibits a good (small) ratio $Q(m_2)/m_2$ and is coprime with $m_1$, then that new point will be on a line of small slope and small y-intercept. Similarly, if a new modulus $m_1m_2m_3$ is formed with another number $m_3$, coprime with $m_1$ and $m_2$, then the new modulus is on a line of smaller-yet slope and minimum y-intercept. More simply put, efficient moduli may be built as the product of smaller, efficient submoduli. It appears from exhaustive searches that the best moduli are highly composite and built from a small set of good, small submoduli.

Additional properties of quadratic residues can be demonstrated by proof of some useful theorems regarding their sequences.

Theorem 2.1 A quadratic-residue sequence will repeat indefinitely after m residues. Proof Sketch. Because $(x\pm m)^2\equiv x^2\pm2mx+m^2\equiv x^2 \pmod m$, the sequence beginning at x will be repeated at x+m.

Theorem 2.2. Each member of the total set of quadratic residues will appear in the first [m/2] values of the sequence. (The [x] notation denotes the ceiling of x and is necessary to correctly cover the cases where m is odd.)

Proof Sketch. By Theorem 2.1, all residues will appear in the first m values in the sequence. But because $(m-x)^2\equiv m^2-2mx+x^2\equiv x^2 \pmod m$, the sequence will play forwards for the first [m/2] values, and then it will play the same subsequence in reverse order. Therefore, all quadratic residues which ever appear in the infinite sequence will appear in the first [m/2] values.

Theorem 2.3. If m is divisible by 4, a quadratic-residue sequence will repeat indefinitely after m/2 residues.

Proof Sketch. Because $(x\pm m/2)^2\equiv x^2\pm mx+m^2/4\equiv x^2 \pmod m$ if m is divisible by 4, the sequence beginning at x will be repeated at x+m/2.

Theorem 2.4. If m is divisible by 4, each quadratic residue in the infinite sequence will appear in the first m/4 values of the sequence.

Proof Sketch. By Theorem 2.1, all residues will appear in the first m/2 values in the sequence. But because $(m/2-x)^2\equiv m^2/4-mx+x^2\equiv x^2 \pmod m$ if m is divisible by 4, the sequence will play forwards for the first m/4 values, and then it will play the same sub-sequence in reverse order. Therefore, all quadratic residues which ever appear in the infinite sequence will appear in the first m/4 values.

Theorem 2.5. If both x and y are quadratic residues, then the product xym is also a quadratic residue for any m.

Proof Sketch. If the integers a and b generate the residues x and y respectively, then the multiplication of the relationships $a^2\equiv x \pmod m$ and $b^2\equiv y \pmod m$ is $(ab)^2\equiv xy \pmod m$. Evidently the product ab generates another quadratic residue, xy (mod m).

Theorem 2.5 states that the set of quadratic residues modulo m is closed under multiplication. Furthermore, it can be shown that if m is prime, the resulting set of quadratic residues forms a multiplicative subgroup of the integers modulo m. The main characteristic of a multiplicative group that is missing for a set of quadratic residues modulo a composite m is that each element in a multiplicative group must have a unique inverse.

The Chinese Remainder Theorem (CRT) is a fundamental and elegant number-theory result known in antiquity to the Chinese.

Theorem 2.6. Integers less than a composite modulus m can be represented uniquely by the set of remainders to a set of relatively prime submoduli of m, whose product is m. Furthermore, integers represented in this fashion may be added, subtracted, and multiplied (modulo m) by adding, subtracting, or multiplying each component, modulo the appropriate submoduli.

The CRT can be explained by example using a modulus (30) and a set of relatively prime submoduli $\{2,3,5\}$. A component CRT notation $\{r_2,r_3,r_5\}$, represents the remainders of a given number to the divisors 2, 3, and 5 respectively. The number typically represented as decimal 17 has a CRT representation $\{1_2,2_3,2_5\}$. The CRT claims that no other integer less than 30 will have the same representation.

In ordinary modulo multiplication, the congruence 17×29≡493≡13 (mod 30). In the CRT representation, the same operation can be represented as $\{1_2,2_3,2_5\}\times\{1_2,2_3,4_5\}\equiv\{(1\times1 \pmod 2))_2, (2\times2 \pmod 3))_3, (2\times4 \pmod 5))_5\}\equiv\{1_2,1_3,3_5\}$. It is easily verified that $\{1_2,1_3,3_5\}$ is a CRT representation of 13, as guaranteed by the CRT. Of importance to engineers is the recognition that the multiplication is completed component wise without reference to information contained in other components.

The representation of quadratic residues using CRT notation follows. Quadratic residues are formed by a squaring operation, which is a special case of multiplication. A possible CRT representation of the quadratic residues, modulo 30, is given as $\{(t^2 2)_2,(t^2 3)_3,(t^2 5)_5\}$. The behavior of this representation for increasing t is shown in Table 1.

TABLE 1

List of Quadratic Residues Modulo 2 × 3 × 5

| t | $t^2$ | $t^2 2$ | $t^2 3$ | $t^2 5$ | $t^2 30$ |
|---|---|---|---|---|---|
| 0 | 0 | 0 | 0 | 0 | 0 |
| 1 | 1 | 1 | 1 | 1 | 1 |
| 2 | 4 | 0 | 1 | 4 | 4 |
| 3 | 9 | 1 | 0 | 4 | 9 |
| 4 | 16 | 0 | 1 | 1 | 16 |
| 5 | 25 | 1 | 1 | 0 | 25 |
| 6 | 36 | 0 | 0 | 1 | 6 |
| 7 | 49 | 1 | 1 | 4 | 19 |
| 8 | 64 | 0 | 1 | 4 | 4 |
| 9 | 81 | 1 | 0 | 1 | 21 |
| 10 | 100 | 0 | 1 | 0 | 10 |
| 11 | 121 | 1 | 1 | 1 | 1 |
| 12 | 144 | 0 | 0 | 4 | 24 |
| 13 | 169 | 1 | 1 | 4 | 19 |
| 14 | 196 | 0 | 1 | 1 | 16 |
| 15 | 225 | 1 | 0 | 0 | 15 |

Each column of quadratic residues is identical to the sequence of quadratic residues modulo 2, 3, and 5 respectively. Generally, they are identical because according to the CRT, each component does not "realize" what the other moduli are doing, or even that they exist. This information is only needed if the number, represented in CRT representation, needs to be translated back to another number system (such as binary or decimal). Because this translation can be non-trivial, CRT representation is not commonly used in applications where either the input or output (or both) are in binary format. The CRT representation, however, is a very efficient approach for arithmetic implementation if alternative representations are not required.

The accuracy of Equation 6 is now evident. Each submoduli $m_i$ generates a series of $Q(m_i)$ quadratic residues, that is, a factor of $Q(m_i)$ more residues as the possibilities for the modulus m are counted. In this case, we see that Q(30)=Q(2)×Q(3)×Q(5)=2×2×3=12 as is evident from the table. The restriction in Conjecture 2.1 that the submoduli are coprime comes from the CRT. Functions which have the form of Equation 6 are called multiplicative or number-theoretic functions. That so many functions in number theory are multiplicative is testimony to the fundamental place of the CRT in mathematics.

Phase-generation circuits in accordance with the invention are compared to those of conventional design below. The phase-generator portion of the DDS (direct digital synthesizer) generates the digital representation of the argument to the sinusoid function (like that in Equation 3). The remaining portion of the DDS (that which takes the sine of the phase argument and converts it to an analog sinusoid) is also described below.

Figure 4:
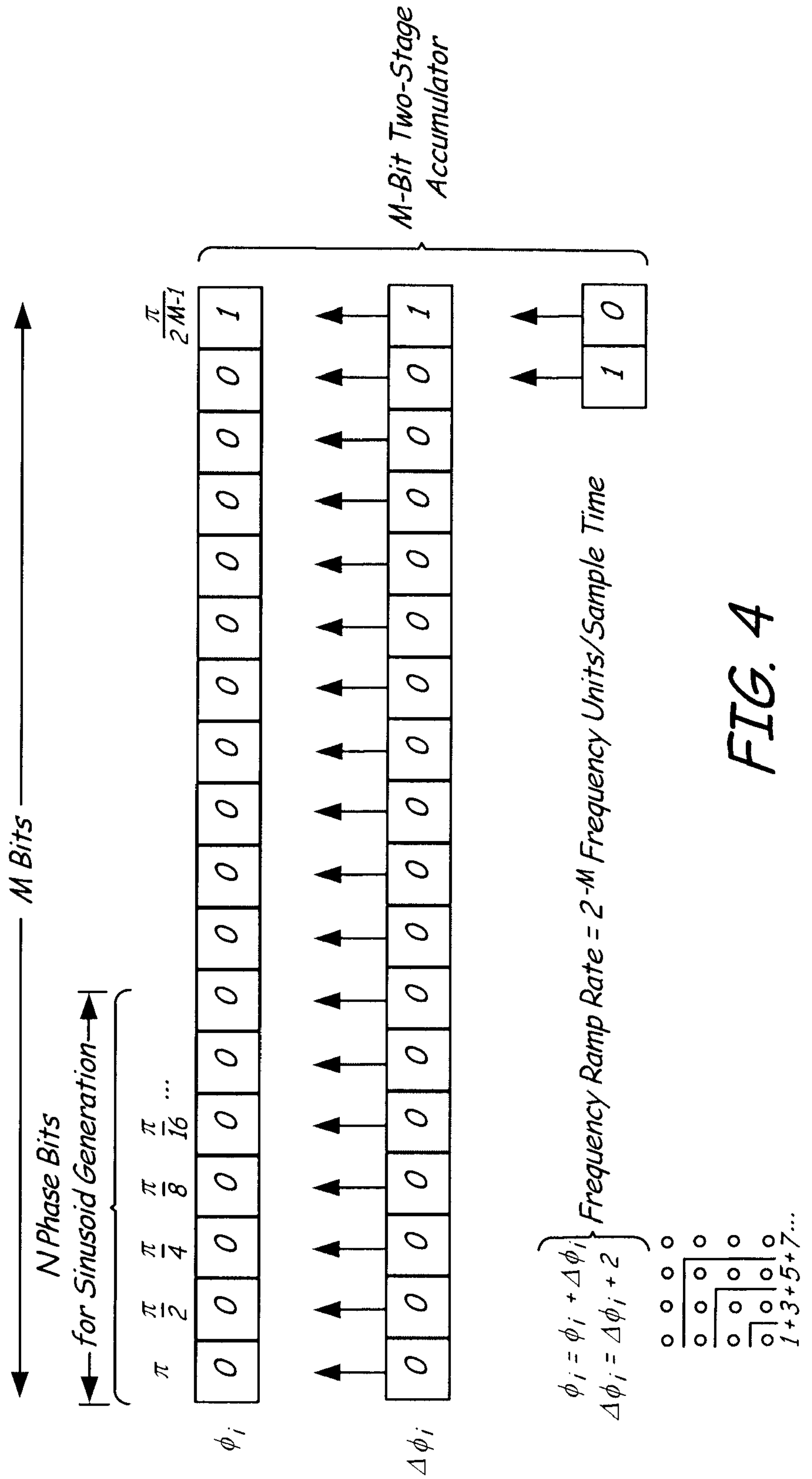
FIG. 4 Prior Art
FIG. 4 is a diagrammatic illustration of conventional hardware for chirp phase generation, modulo $2^{18}$.

FIG. 4 illustrates a traditional, optimized method to generate the phase argument, modulo a power of 2. In particular, FIG. 4 shows an implementation for chirp phase generation modulo $2^{18}$. This method is based on the identity $$\sum_{k=1}^{n}(2k-1)=n^2. \qquad \text{Eq. (7)}$$

Equation 7 states that the sequence of squares is generated by the sum of odd integers, that is, {1, 1+3, 1+3+5, 1+3+5+7 . . . } are the squares. This function is implemented by a two-stage accumulator, where the addend to the phase starts at 1 and increases by 2 with every clock cycle. The modulus operation is implemented simply by ignoring the carry-out of the most-significant-bit in the top accumulator.

The digital circuit shown in FIG. 4 is difficult to implement at high frequency. The difficulty arises from the fact that the most-significant-bit calculation is a function of all of the lesser-significant-bit calculations. Standard techniques such as carry-lookahead and pipelining are typically used to obtain reasonable clock frequencies, at the price of very high power. Modern bipolar-technology implementations of this type of circuit may reach into the few-GHz frequency range, but may consume several tens of Watts.

According to Equation 5, $Q(2^{18}=262{,}144)=43{,}693$ quadratic residues for this modulus. Thus only about one sixth of the phases which could be represented in this hardware will actually occur. Thus with sufficient cleverness, the representation could be reduced by as much as two bits, down to perhaps 16 bits. However, it appears that if a modulus of $2^{18}$ is chosen, the concept of quadratic residues does not lead to a significant design improvement. This statement appears to be true for other power-of-two moduli, as well.

The use of a CRT-type representation for DDS applications is known. Jr. Chren, W. A. Area and latency improvements for direct digital synthesis using the residue number system. In Circuits and Systems, 1994, Proceedings of the 37th Midwest Symposium on, volume 1, pages 269-273 vol. 1, 1994. This reference proposes a use of a residue number system (RNS) as an improved technique for sinusoid generation in the digital domain. However, Mohan later invalidated Chren's use of a RNS in that paper. P. V. A. Mohan. On RNS-based enhancements for direct digital frequency synthesis. Circuits and Systems II: Analog and Digital Signal Processing, IEEE Transactions on [see also Circuits and Systems II: Express Briefs, IEEE Transactions on], 48(10): 988-990, 2001.

A review of moduli in the vicinity of $2^{18}=262{,}144$ turns up an interesting modulus, $(2^6-1)\times2^6\times(2^6+1)=262{,}080$. Breaking down this number into its prime factorization, we find that the number of quadratic residues for this modulus is Q(64)×Q(5)×Q(7)×Q(9)×Q(13)=4,032. This modulus exhibits an order of magnitude fewer residues than does the modulus $2^{18}$ even though the moduli differ only by one part in ten thousand.

Figure 5:
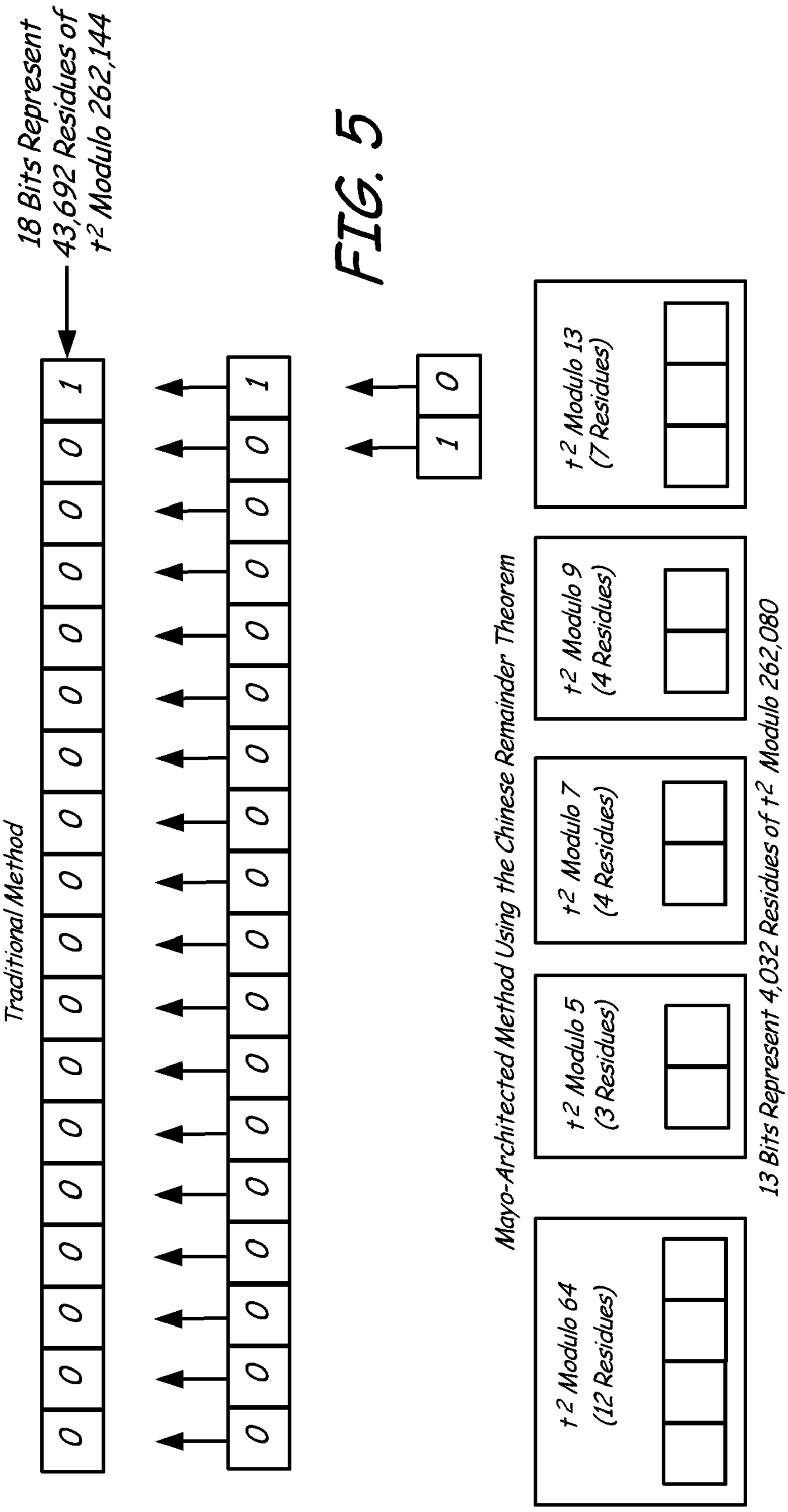
FIG. 5 is a diagrammatic comparison of the chirp phase generation method of the invention to a conventional chirp phase generation method.

FIG. 5 is a diagrammatic comparison of the chirp phase generation method of the invention to a conventional chip phase generation method. For each of the submoduli listed in FIG. 5, the number of quadratic residues Q, and the minimum number of digital bits required to represent Q is shown. For example, FIG. 5 shows that Q(5)=3, and that 2 bits are required to represent each of the residues modulo 5. In total, we find that only 13 bits are required to represent the phase.

While this reduction is a substantial improvement over the conventional solution, an important advantage of the proposed system is that the large accumulator circuit has been factored into several, much smaller sequence generators which can exhibit both significantly-higher performance and much-lower power.

The following discussion focuses on the second major function of a DDS, which implements the translation of the digital phase representation into an analog sinusoid (or sinusoid-related function). Conventional implementations approximate the phase by using only the top M bits, and then use that set of bits as an address to a table-lookup ROM which generates the digital representation of the sine of the given phase to a uniform digital-to-analog converter (DAC). Two separate approximations exist using this scheme. First, the truncation operation introduces an error in the phase which may be as large as the least-significant-bit magnitude. Second, the lookup table/DAC combination introduces quantization-approximation effects. These approximations limit the "in principle" performance of the system. Of course, circuit impediments and imperfections, as implemented in a real system, reduce system quality further yet.

The table-lookup ROM in such a system can be very large, consume high power, and limit performance severely. Because of these factors, DDS researchers have been very active in proposing simplifications to the conversion function. One strategy implements numerical approximations for the calculation of the sine function; another strategy is to employ digital approximations to the function sin(Ø); another strategy is to introduce analog interpolation techniques into the DAC itself. Hybrid strategies employing several similar techniques also abound in the literature.

A method in accordance with the present invention for calculation of the sinusoid, and its conversion into analog form, may be factored into small, nonlinear digital-to-analog converters (DACs) whose digital inputs are independent of each other. Furthermore, these independent digital inputs are the same as the CRT representation presented above.

In a simple version of the invention, the phase is represented in two components, relative to coprime submoduli a and b, where the overall modulus is the product ab. We denote the phase as $\{A_a,B_b\}$, where the scalar components A and B will sequence through the quadratic residues modulo a and b respectively. We again use the CRT to decompose the phase by the congruence $\{A_a+B_b\}\equiv\{A_a,0\}+\{0, B_b\}$ to arrive at the relations $$\sin_m(\{A_a, B_b\}) = \sin_m(\{A_a, 0\} + \{0, B_b\}) \quad \text{Eq. (8)}$$

$$= \sin_m(\{A_a, 0\})\cos_m(\{0, B_b\}) + (\{A_a, 0\})\sin_m(\{0, B_b\}) \quad \text{Eq. (9)}$$

A notational sleight-of-hand in these equations is explained as follows. The + sign binary operator in Equation 8 denotes normal (non-modulo) addition, but in the proposed decomposition congruence $\{A_a+B_b\}\equiv\{A_a,0\}+\{0, B_b\}$ the + sign also denotes an ambiguity in the summation, if interpreted as normal addition, which can in fact only be guaranteed correct modulo the full-circle angle by the CRT. In general it is incorrect to mix incommensurate operators in this manner. However, in this specific case, the introduced ambiguity is an added term of the form $2\pi n$. Therefore, the ambiguity introduced by the CRT addition is exactly the type which is irrelevant when taking the sine. This realization is important to the invention.

Equation 9 states that the sine of the phase represented by the CRT vector $\{A_a,B_b\}$ can be generated in two multiplications (and one addition) of trigonometric functions which are only functions of either $A_a$ or $B_b$ (never both). An implementation of Equation 9 in hardware can therefore be realized with 4 DACs (two to generate the sine and cosine of the angle whose CRT representation is $\{A_a,0\}$, and two to generate the sine and cosine of the angle whose CRT representation is $\{0,B_b\}$), two multipliers, and one adder. The input to each of the DACs comes from only one component of the CRT representation.

The calculation of the phases represented by $\{A_a,0\}$ and $\{0,B_b\}$, as each component walks through their respective quadratic residues, is straightforward using computer-algebra tools such as Mathematica. The repeating voltage sequences given by the sine and cosine of $\{A_a,0\}$ will contain at most Q(a) different voltages. While it is possible to quantize the voltage into a binary representation, and convert these voltages using a conventional, uniform DAC, an alternative and perhaps better approach is to use a "nonlinear" DAC which is designed to play a limited number of unquantized, nominally "exact" voltages. Such DACs are relatively easy to design for high-speed operation when Q(a) is relatively small.

Figure 6:
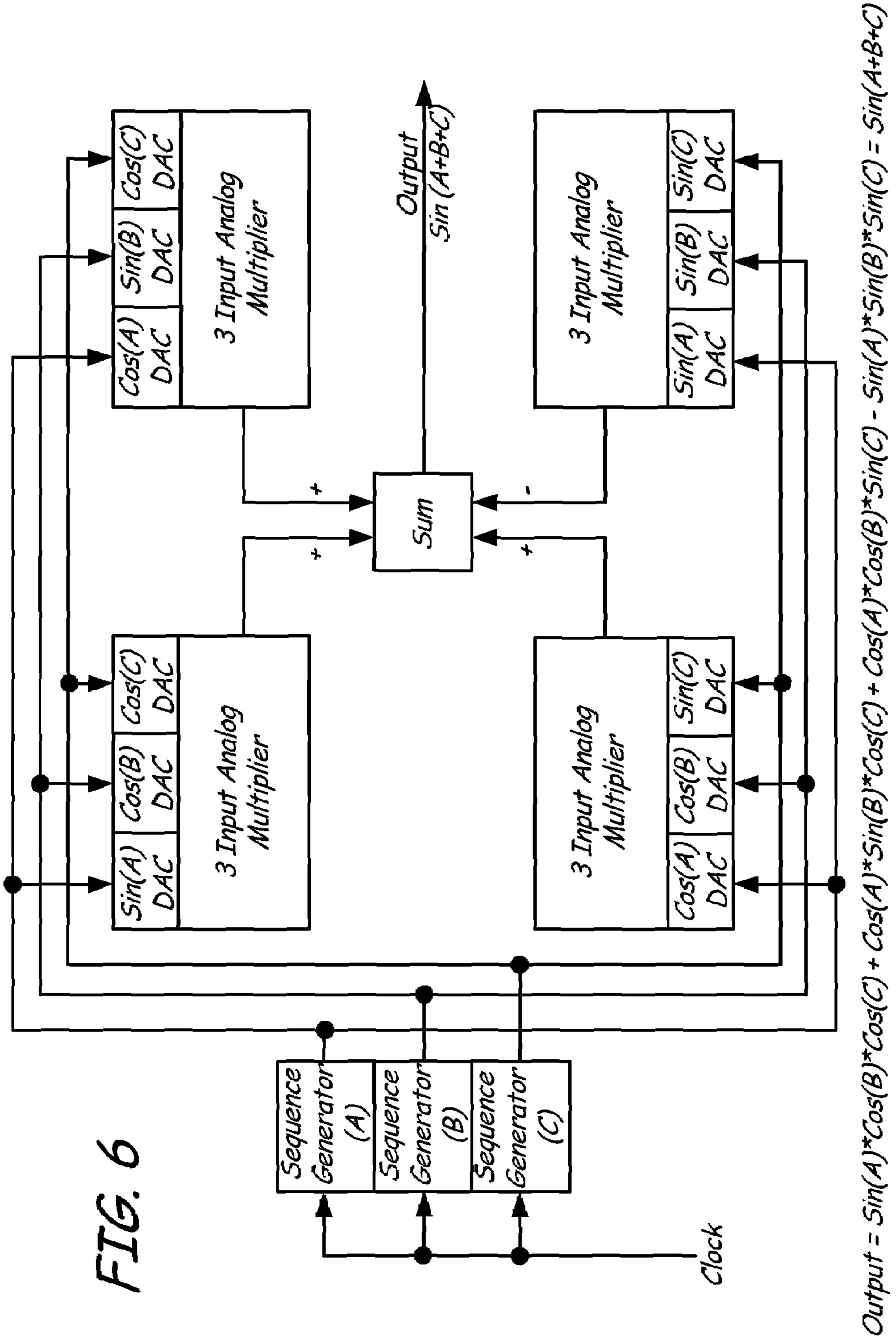
FIG. 6 is a block diagram of a chirp waveform signal generator in accordance with the present invention based on three submoduli.

The same basic idea may be applied in more-complex CRT representations involving more than two moduli. FIG. 6 is an illustration of a block diagram for a chirp-waveform generator based on the decomposition given by the congruence $\{A_a, B_b, C_c\}\equiv\{A_a, 0, 0\}+\{0, B_b, 0\}+\{0, 0, C_c\}$ and the trigonometric identity for the sine of the sum of three angles.

The multiplication and addition blocks in FIG. 6, while drawn to be implemented in the analog domain, may also be implemented in the digital domain. If designed in the digital domain, the invention represents a very competitive sinusoid-calculation technique which efficiently factors a large lookup ROM into several much smaller ROMs (represented by DACs in the figure) at the cost of a few multiplications. Unlike other digital implementations, this method gives exact results to the precision of the hardware arithmetic for all phases. Because the multiplier circuits need not be general multipliers (the set of input multiplicands is very limited), the multiplier implementation may be greatly simplified.

However, implementations of a high-precision digital multiplier are generally not low power or high speed, relative to their analog equivalents. Additionally, the digital domain option still requires an analog-domain, high-precision DAC. The preliminary assessment of the precision tradeoffs between the design of a large, conventional DAC, and the design of small unconventional DACs with analog arithmetic, is that the design difficulty is approximately the same. A preferred embodiment of this invention favors the all-analog approach because of its significantly higher-speed and lower-power characteristics.

FIG. 6 shows a way to factor a large modulus m into three smaller submoduli. However, practical applications, with m in the many-hundred-thousand range, cannot be implemented in only three submoduli because the underlying unconventional DACs are impractical for large submoduli. It is therefore advantageous to factor the problem further. More submoduli may be split out in parallel fashion by representing the phase in N CRT components and using the trigonometric identity for the sum of N angles. However, because a realization implementing N components will require many N-input multipliers, an approach using more than 3 or 4 submoduli may not be practical using this technique.

A method to further split each submoduli into smaller "sub-submoduli" which is essentially a nesting of the basic technique is described below. The A-component of the phase $\{A_a,B_b,C_a\}$ may itself be represented in CRT notation relative to, for example, the sub-submoduli $a_1$ and $a_2$, whose product must be a. $A_a$ can be expressed by the congruence $A_a \equiv \{\alpha_{a1},\beta_{a2}\} \equiv \{\alpha_{a1},0\}+\{0,\beta_{a2}\}$ if a is composite. Now according to FIG. 6, the sine and cosine of the sequence of phases given by $\{A_a,0,0\}$ are needed. But because $\{A_a,0,0\}$ is itself the sum of two angles represented by $\{\alpha_{a1},0,0,0\}+\{0,\beta_{a2},0,0\}$, the sine and cosine of $\{A_a,0,0\}$ can be calculated from its components. The sinusoid is calculated similarly to the process outlined in Equation 8. The cosinusoid is calculated by its trigonometric identity $$\begin{aligned}\cos_m(\{\alpha_{a1},B_{a2}\}) &= \cos_m(\{\alpha_{a1},0\}+\{0,B_{a2}\}) \\ &= \cos_m(\{\alpha_{a1},0\})\cos_m(\{0,B_{a2}\}) - \\ &\quad \sin_m(\{\alpha_{a1},0\}\sin_m(\{0,B_{a2}\})\end{aligned} \quad \text{Eq. (10)}$$

Any composite modulus (or sub modulus) can be broken down in this manner, at the price of additional, stacked layers of multiplication and addition.

Figure 7:
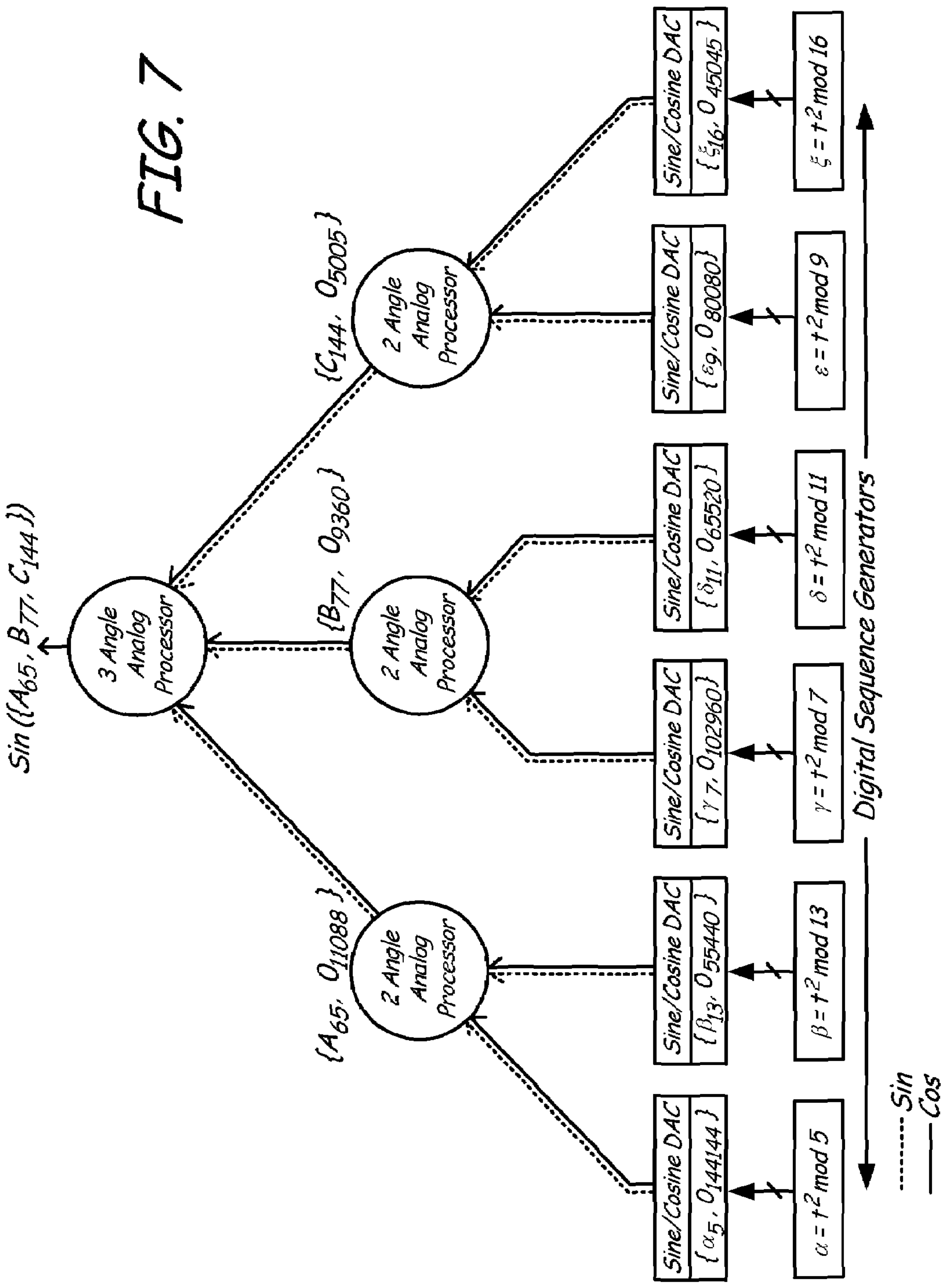
FIG. 7 is a block diagram of a chirp waveform signal generator in accordance with the invention based on factorizations of the modulus 720,720.

FIG. 7 shows one of the possible factorizations of the modulus 720,720 in tree-diagram format. A simple and effective strategy for finding good implementations is to arrange the branches of the tree such that the complexity of the branches are approximately balanced (as measured by the number of quadratic residues in each branch). For brevity's sake the angle represented by $\{\alpha_5,0_{13},0_7,0_{11},0_9,0_{16}\}$ may be written equivalently as $\{\alpha_5,0_{144,144}\}$. Technical details for the digital and analog sequences for this design are presented below.

Advantages of the combination of the quadratic-residue CRT representation and the preferred analog-conversion technique include the following.

- Judicious choice of a modulus allows significant reduction in the number of bits needed to represent the required phases of the chirp waveform.
- The high-speed generation of the digital phase sequence is greatly simplified by the factorization of the sequence into small independent packets via the CRT.
- The phase representation is exact and all phase information is used properly in the conversion from digital phase to analog sinusoid.
- Digital phase is converted exactly (in principle) to analog sinusoid without ROM look-up tables, high-speed digital approximations, or DAC approximations of any kind.
- Quantization noise is eliminated in this design, although analog precision issues remain (as they do in a conventional DAC implementation). In this design, typical DDS signal-performance metrics, such as spur-free dynamic range, are determined by the analog precision (not the quantization) of the unconventional DACs, the precision of the analog multiply-and-add blocks, and the glitch performance of the implementation.

The DDS architecture described above is optimized for a chirp waveform of a given normalized frequency-ramp rate. The inherent lack of flexibility in such a design is a justifiable criticism of special-purpose designs in applications where waveform agility is at a premium. The following is an outline of the programmable features of the invention already inherent in the design, and to propose optional features which may be added to the basic invention to increase its agility.

The starting phase is an important parameter, which is easily programmable in this design. To sweep frequencies starting at DC, each CRT component should be reset to $0^2$ modulo the component's modulus (that is, the representation of zero). To start at an instantaneous frequency which normally would start at the sampling instant t, the component registers should be preloaded with the CRT representation of $t^2$. Because the digital sampling of the chirped sinusoid is both an even and a repetitive function, there is a starting phase for which the output will start at high instantaneous frequency and decrease down to DC. Therefore the design supports both positive and negative frequency-ramp rates (of equal magnitude).

The normalized frequency ramp rate is also an important parameter, but it is not programmable in the design, as presented thus far. The absolute ramp rate is directly related to the sampling rate: a simple divide-by-two circuit in the clock path will, for example, reduce the ramp rate by a factor of four. A simple way to implement a programmable ramp rate is to feed the DDS with a programmable-rate clock. In some applications, however, the side effects arising from a change in the DDS clock may not be acceptable. The following therefore focuses on solutions which change the ramp rate without changing the sample rate.

The first solution is suggested by the introduction of a decimation factor n into the fundamental chirp equation $$f_t = \sin_m((nt)^2 \bmod m) \quad \text{Eq. (11)}$$

$$= \sin_m(n^2t^2 \bmod m) \quad \text{Eq. (12)}$$

which speeds up the ramp rate by a factor of n. The number $n^2t^2$ is a quadratic residue modulo m. Therefore any sequence of this type can be reproduced with hardware that supports all quadratic residues of m. The sequence is formed by taking every $n^{th}$ sample of the original residue sequence. In the DDS architecture described herein, the overall sequence can be generated by a circuit which steps through its residues by n instead of by 1 at the input to each of the DACs. If, and only if, the decimation factor n is relatively prime to the modulus m, then the sequence runs through all possible quadratic residues (but in a different permutation). If n is not relatively prime to m, then the sequence runs through a subset of the quadratic residues of m. In either case, the method can generate a set of ramp rates of the form {r,2r,3r,4r . . . }, if the digital sequence generators are sufficiently programmable. The method is applicable to all m.

A less-general method which can modulate the ramp rate r by an irrational factor is as follows. Consider the following chirp equations $$f_t = \sin_m\left(\left(\sqrt{k}t\right)^2 \bmod m\right) \quad \text{Eq. (13)}$$

$$= \sin_m(kt^2 \bmod m) \quad \text{Eq. (14)}$$

where k is some integer. Equation 13 makes it clear that the sequence traces out a chirp waveform $\sqrt{k}$ faster than the nominal chirp (Equation 3). If k is restricted to integers which are quadratic residues modulo m, then by Theorem 2.5 the phase argument $kt^2m$ is also a quadratic residue modulo m and therefore can be played on the same hardware.

Figure 8:
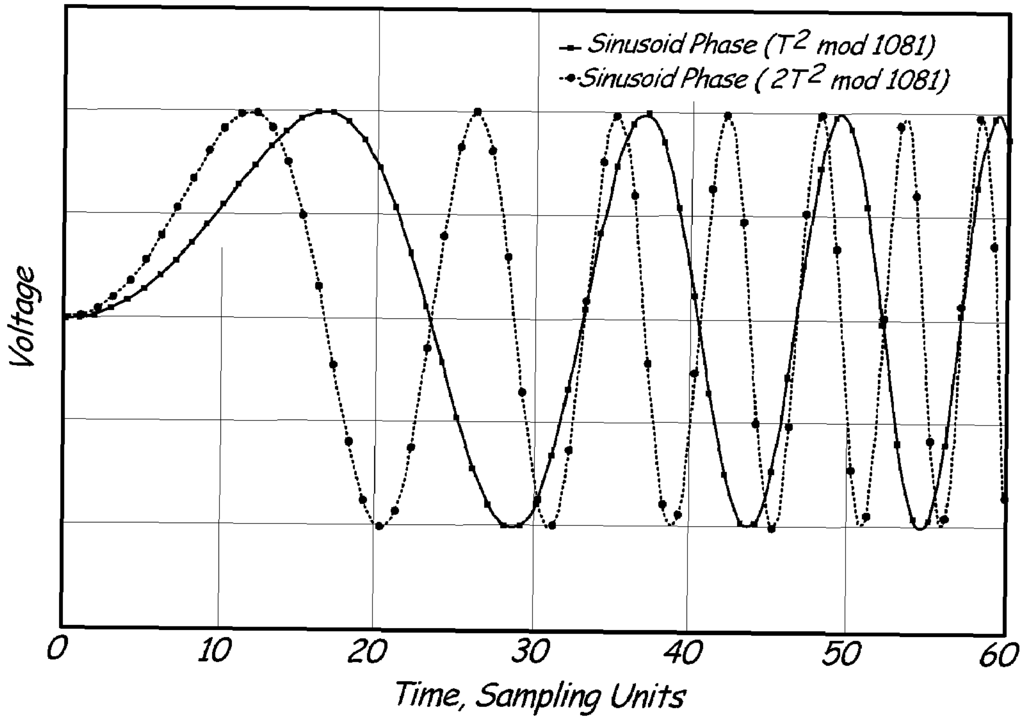
FIG. 8 is a graph of two chirp waveforms generated using different permutations of the quadratic reside phases of a given modulus.

This concept can be demonstrated by showing two chirp waveforms of irrationally-related ramp rates, built from the same voltages corresponding to the modulus 1081. Because 2 is a quadratic residue of 1081 (the modulus 1081 is the product of two relatively prime submoduli of the form $(n^2-2)$, 23 and 47), the waveform $\sin_m(2t^2 \bmod m)$ can be reproduced from the voltages used to reproduce the waveform $\sin_m(t^2 \bmod m)$. FIG. 8 shows the initial behavior of these two waveforms. The two waveforms exhibit ramp rates which differ by a factor of $\sqrt{2}$.

The ramp rates r and $\sqrt{2}$r can therefore be generated if 2 is a quadratic residue of m. If both of these sequences are decimated (as in Equation 13) then the analog hardware will support ramp rates of the form $\{r, \sqrt{2}\, r, 2r, 2\sqrt{2}\, r, 3r, 4r, 3\sqrt{2}\, r \ldots\}$ if sufficient flexibility is built into the digital sequence generators. Further granularity can be achieved if the modulus m simultaneously exhibits other small quadratic residues; a modulus which has both 2 and 3 as quadratic residues would support ramp rates of the form $\{r, \sqrt{2}\, r, \sqrt{3}\, r, 2r \ldots\}$.

However, such added restrictions will eventually limit the field of available moduli too severely. By the CRT, if a large composite m exhibits a quadratic residue of 2, then each submoduli in the prime factorization of m must also exhibit a quadratic residue congruent to 2. But, only about half of prime moduli have 2 as a quadratic residue, and some simply-implemented submoduli candidates (such as 3 and 5) would be disallowed. However, these restrictions are not too constraining, and future research into implementations of programmable digital-sequence generators to support these options is warranted.

Although this report has specifically focused on the efficient implementation of base band, low-ramp-rate, chirped-sinusoid generators, elements are applicable in wider DDS applications. For example, the use of quadratic residues and their CRT representation is applicable to generalized periodic waveforms (not only sinusoids) whose phase argument varies quadratically with time. Because any periodic waveform can be represented as the sum of sinusoids by the Fourier Theorem, it is always possible to use the CRT representation, with corresponding independent DACs and post processing, to generate the generalized chirped waveform using the same architecture as this proposal. The details of the DAC design and the post processing functions will depend strongly on the nature of the periodic function. A topic for future research might be to investigate the nature of the periodic waveforms which might be constructed by simpler, or easier to implement, post processing functions than the sinusoid's two multiplications and one addition.

While quadratic residues are useful for chirped waveforms, the advantages of the CRT representation and its proposed analog conversion stand independently without the use of quadratic residues. Another major family of sinusoid DDS circuits, for example, use a conventional programmable accumulator of a moderate number of bits (e.g., 8 bits). These DDSs use modulo-256 arithmetic and simple accumulation to generate a linearly-changing phase, outputting a simple sinusoid after analog conversion. Changing the accumulation constant changes the output frequency.

Application of the concepts described herein yield the following design. A modulo-252 accumulator can be implemented, for example, by factoring the modulus into smaller accumulators based on the submoduli 4, 7, and 9. Programmable phase increments are implemented by adding a programmable constant (in its CRT representation) independently to each of the sub-accumulators. Independent DACs generate the sine and cosine of each of 4, 7, and 9 phases. The analog post processing shown in FIG. 6 remains unchanged for this type of DDS.

The description herein is focused on the generation of a base band signal. Quadrature base band outputs are useful in mixing applications where a single-sideband mixer output is desired. The DACs required to generate a cosine output are exactly those required to generate the sinusoid output (the sine and cosine values of the component angles), and the circuit which generates the sine of a sum of angles can be exactly the circuit which generates the cosine of a sum of angles (with reconfigured inputs). Therefore, quadrature outputs can be obtained by extending the final analog post-processing unit to generate the cosine waveform.

The following is an example of a method for calculating the sine and cosine DAC sequences necessary to support the DDS machine shown in FIG. 7. The machine shown in FIG. 7 is based on the factorization 720,720=(5×13)×(7×11)×(9×16). The modulo-5 DAC will play repeating sequences of angles represented in our CRT notation by $\{\alpha_5,0_{13},0_7,0_{11},0_9,0_{16}\}$o$\{\alpha_5,0_{144144}\}$. Because the integer represented by $k=\{\alpha_5,0_{144144},\}$ is clearly a multiple of 144,144, both k and the full-circle angle 720,720 can be divided by 144,144 to represent the angle where now the modulus 5 is the full-circle angle.

The sequence of quadratic residues modulo 5 gives a repeating through the sequence {0, 1, 4, 4, 1}. Converting $\{\alpha_5,0_{144,144}\}$ by a convenient approach such as Mathematica gives the angles {0, 4*144,144, 1*144,144, 1*144,144, 4*144,144} (out of 720,720), or {0,4,1,1,4} out of 5. The sine sequence is therefore {0., −0.951057, 0.951057, 0.951057, −0.951057}; the cosine sequence is {1., 0.309017, 0.309017, 0.309017, 0.309017}.

Results of the remaining moduli are summarized as follows.

The sequence of quadratic residues modulo 13 is {0, 1, 4, 9, 3, 12, 10, 10, 12, 3, 9, 4, 1}. Conversion to phase angles yields the sequence {0, 5, 7, 6, 2, 8, 11, 11, 8, 2, 6, 7, 5}, giving a sine sequence {0., 0.663123, −0.239316, 0.239316, 0.822984, −0.663123, −0.822984, −0.822984, −0.663123, 0.822984, 0.239316, −0.239316, 0.663123} and a cosine sequence {1., −0.748511, −0.970942, −0.970942, 0.568065, −0.748511, 0.568065, 0.568065, −0.748511, 0.568065, −0.970942, −0.970942, −0.748511}.

The sequence of quadratic residues modulo 7 is {0, 1, 4, 2, 2, 4, 1}. Conversion to phase angles yields the sequence {0, 2, 1, 4, 4, 1, 2}, giving a sine sequence {0., 0.974928, 0.781831, −0.433884, −0.433884, 0.781831, 0.974928} and a cosine sequence {1., −0.222521, 0.62349, −0.900969, −0.900969, 0.62349, −0.222521}.

The sequence of quadratic residues modulo 11 is {0, 1, 4, 9, 5, 3, 3, 5, 9, 4, 1}. Conversion to phase angles yields the sequence {0, 3, 1, 5, 4, 9, 9, 4, 5, 1, 3}, giving a sine sequence {0., 0.989821, 0.540641, 0.281733, 0.75575, −0.909632, −0.909632, 0.75575, 0.281733, 0.540641, 0.989821} and a cosine sequence {1., −0.142315, 0.841254, −0.959493, −0.654861, 0.415415, 0.415415, −0.654861, −0.959493, 0.841254, −0.142315}.

The sequence of quadratic residues modulo 9 is {0, 1, 4, 0, 7, 7, 0, 4, 1}. Conversion to phase angles yields the sequence {0, 4, 7, 0, 1, 1, 0, 7, 4}, giving a sine sequence {0., 0.34202, −0.984808, 0., 0.642788, 0.642788, 0., −0.984808, 0.34202} and a cosine sequence {1., −0.939693, 0.173648, 1., 0.766044, 0.766044, 1., 0.173648, −0.939693}.

The sequence of quadratic residues modulo 16 is {0, 1, 4, 9, 0, 9, 4, 1}. Conversion to phase angles yields the sequence {0, 13, 4, 5, 0, 5, 4, 13}, giving a sine sequence {0., −0.92388, 1., 0.92388, 0., 0.92388, 1., −0.92388} and a cosine sequence {1., 0.382683, 0., −0.382683, 1., −0.382683, 0., 0.382683}.

The conversion from quadratic-residue sequence to phase-angle sequence depends on the product of the other moduli. This inter-modulus dependence (which occurs only at design time) means that it is not possible, in general, to build a simple sequence generator and DAC for a given moduli and expect the design to service all possible m.

Although the present invention has been described with references to preferred embodiments, those skilled in the art will recognize that changes can be made in form and detail without departing from the spirit and scope of the invention.

What is claimed is:

1. A chirp waveform generator for producing a chirp waveform $f(t)=\sin(t^2 \text{ modulus m})$ where modulus m is represented by n submoduli and/or factored submoduli $m_1$-$m_n$, including:

sequence generators for generating digital sequence values representative of sequences of quadratic residues for each submoduli and/or factored submoduli $m_1$-$m_n$;

sine and cosine digital-to-analog converters (DACs) connected to the sequence generators, for receiving the digital sequence values for each submoduli and/or factored submoduli $m_1$-$m_n$ and for producing sequences of corresponding analog sine and cosine signals; and an analog processor connected to the DACs for combining the sine and cosine signals to produce the chirp waveform.

2. The chirp waveform generator of claim 1 wherein the analog processor includes adders and multipliers.

3. The chirp waveform generator of claim 1 wherein ($t^2$ modulus m) is an implemented phase argument that approximates a desired phase argument ($\pi r t^2$).

4. The chirp waveform generator of claim 3 wherein the submoduli and/or factored submoduli are relatively small integers.

5. The chirp waveform generator of claim 1 wherein the sequence generators include programmable inputs for controlling the chirp waveform.

6. The chirp waveform generator of claim 5 wherein the programmable inputs enable control over waveform parameters including starting phase, ramp rate and frequency.

7. A sinusoid waveform generator for producing a sinusoid waveform $f(t)=\sin(t \text{ modulus m})$ where modulus m is represented by n submoduli and/or factored submoduli $m_1$-$m_n$, including:

sequence generators for generating digital sequence values representative of sequences of linear residues for each submoduli and/or factored submoduli $m_1$-$m_n$;

sine and cosine digital-to-analog converters (DACs) connected to the sequence generators, for receiving the digital sequence values for each submoduli and/or factored submoduli $m_1$-$m_n$ and for producing sequences of corresponding analog sine and cosine signals; and an analog processor connected to the DACs for combining the sine and cosine signals to produce the sinusoid waveform.

8. The sinusoid waveform generator of claim 7 wherein the analog processor includes adders and multipliers.

9. The sinusoid waveform generator of claim 7 wherein (t modulus m) is an implemented phase argument that approximates a desired phase argument ($\pi r t$).

10. The sinusoid waveform generator of claim 9 wherein the submoduli and/or factored submoduli are relatively small integers.

11. The sinusoid waveform generator of claim 7 wherein the sequence generators include programmable inputs for controlling the sinusoid waveform.

12. The sinusoid waveform generator of claim 11 wherein the programmable inputs enable control over waveform parameters including starting phase and frequency.

13. The invention of claim 7 and further including:

a plurality of the sinusoid waveform generators for providing a plurality of sinusoid waveforms; and a second analog processor for combining the plurality of sinusoid waveforms to produce a non-sinusoidal waveform.

* * * * *